(12) United States Patent
Trimberger (10) Patent No.: US 6,573,748 B1
(45) Date of Patent: Jun. 3, 2003

(54) PROGRAMMABLE LOGIC DEVICE WITH OUTPUT REGISTER FOR SPECIFYING MEMORY SPACE DURING RECONFIGURATION

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 30 days.

(21) Appl. No.: 10/005,448

(22) Filed: Nov. 6, 2001

(51) Int. Cl.[7] .............................................. H03K 19/173
(52) U.S. Cl. .............................. 326/38; 326/40; 326/41; 365/236; 365/189.02
(58) Field of Search ......................... 326/38–41, 56–58; 365/236, 189.02, 230.06, 230.08

(56) References Cited

U.S. PATENT DOCUMENTS

| | | | | |
|---|---|---|---|---|
| 5,923,614 A | * | 7/1999 | Erickson et al. ............. | 365/236 |
| 5,999,020 A | | 12/1999 | Volk et al. | |
| 6,031,391 A | * | 2/2000 | Couts-Martin et al. ....... | 326/38 |
| 6,191,608 B1 | * | 2/2001 | Cliff et al. ..................... | 326/38 |
| 6,239,613 B1 | * | 5/2001 | Reddy et al. .................. | 326/39 |
| 6,326,806 B1 | * | 12/2001 | Fallside et al. ................ | 326/38 |

OTHER PUBLICATIONS

Xilinx, Application Note, XAPP178 (v0.9), "Configuring Spartan–II FPGAs from Parallel EPROMs", published Dec. 3, 1999, pp. 1–9, available from Xilinx, Inc., 2100 Logic Drive, San Jose, California 95124.

Xilinx Product Specification DS030 (v1.7) "Spartan Family of One–Time Programmable Configuration PROMs (XC17S00)" Apr. 7, 2001, pp. 1–9, available from Xilinx, Inc., 2100 Logic Drive, San Jose, California 95124.

Xilinx Product Specification DS026 (v2.9) "XC18V00 Series of In–System Programmable Configuration PROMs" Sep. 28, 2001, pp. 1–18, available from Xilinx, Inc., 2100 Logic Drive, San Jose, California 95124.

* cited by examiner

Primary Examiner—Michael Tokar
Assistant Examiner—Vibol Tan
(74) Attorney, Agent, or Firm—Arthur J. Behiel; Edel M. Young (57) ABSTRACT

Described are programmable logic systems and methods in which programmable logic devices receive configuration data. In some embodiments, one or more input/output blocks of a programmable logic device are adapted to store a value identifying a remote memory space as a source of reconfiguration data. In other embodiments, external memory spaces for storing configuration data are adapted to store the value.

21 Claims, 8 Drawing Sheets

PROGRAMMABLE LOGIC DEVICE WITH OUTPUT REGISTER FOR SPECIFYING MEMORY SPACE DURING RECONFIGURATION

FIELD OF THE INVENTION

This invention relates generally to programmable logic devices, and in particular to programmable logic devices that select from among a plurality of memory spaces during partial or complete reconfiguration.

BACKGROUND

A programmable logic device (PLD) is a well-known type of digital integrated circuit that may be programmed by a user (e.g., a circuit designer) to perform specified logic functions. PLDs are becoming ever more popular, largely because they are less expensive in relatively small quantities and require less time to implement than semi-custom and custom integrated circuits.

Figure 1:
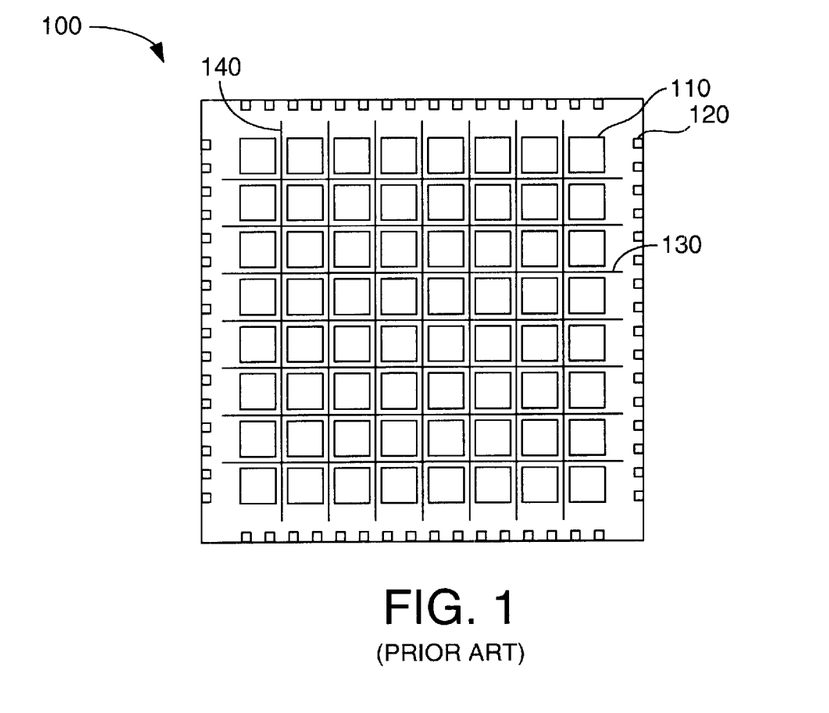
FIG. 1 (prior art) is a block diagram of one type of PLD, a field-programmable gate array (FPGA) 100.

FIG. 1 (prior art) is a block diagram of one type of PLD, a field-programmable gate array (FPGA) 100. FPGA 100 includes an array of configurable logic blocks (CLBs) 110 that are programmably interconnected to each other and to programmable input/output blocks (IOBs) 120. The interconnections are provided by a complex interconnect matrix represented as horizontal and vertical interconnect lines 130 and 140. This collection of configurable elements and interconnect may be customized by loading "configuration data" into internal configuration memory cells (not shown) that define how the CLBs, interconnect lines, and IOBs are configured. The configuration data may be read from memory. (e.g., an external PROM) or written into FPGA 100 from an external device. The collective program states of the individual memory cells then determine the function of FPGA 100.

Figure 2:
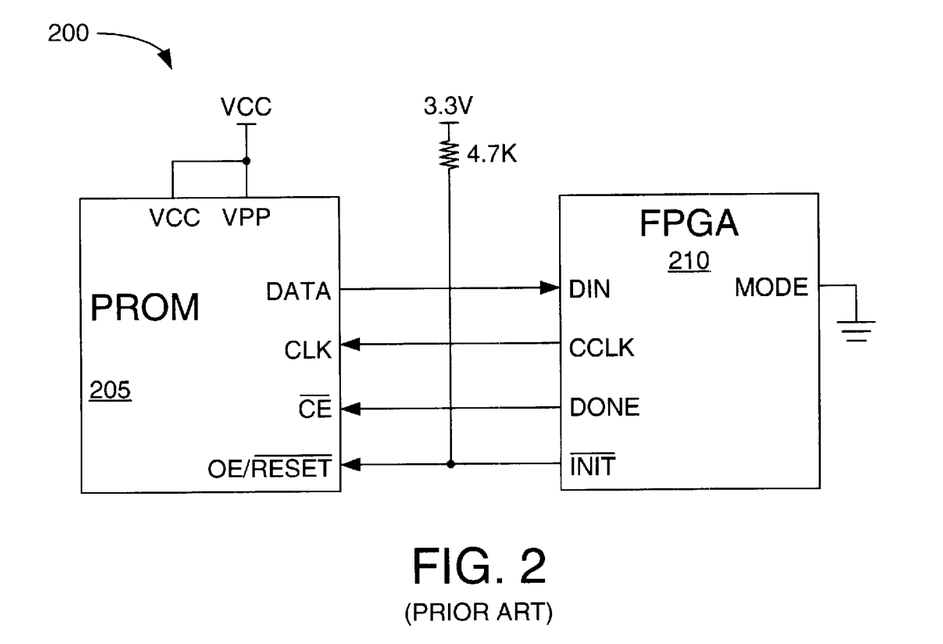
FIG. 2 (prior art) depict a typical programmable logic system 200 in which a memory 205 stores the requisite configuration data for defining the logical function of an FPGA 210.

FIG. 2 depicts a typical programmable-logic system 200 in which a memory 205 stores the requisite configuration data for defining the logical function of an FPGA 210. Memory 205 is, in one example, a member of the Spartan ® family of PROMs available from Xilinx, Inc., of San Jose, Calif. It is important to note, however, that myriad forms of memory are suitable for storing configuration data. In a recent example, configuration data has been conveyed to remote sites via the Internet.

Prior to configuration, FPGA 210 resets an address counter in memory 205 by providing a logic zero to a reset and output-enable pin OE/RESET bar on memory 205. Then, during configuration, terminal CCLK from FPGA 210 drives a data clock CLK on memory 205 as configuration data transfers from an output terminal DATA to an input terminal DIN of FPGA 210. FPGA 210 asserts (drives high) a DONE signal at the close of configuration. The high DONE signal de-asserts the chip-enable terminal CE bar of memory 205. The process of loading configuration data is repeated each time FPGA 210 is powered on or reset.

It is sometimes desirable to provide a programmable logic device with a number of potential configuration options. Assuming, for example, that an FPGA is to be used as a signal processor, it might be useful to provide different configurations for the FPGA so the chip could easily be adapted for use with more than one communication standard.

System 200 offers a limited ability to provide alternative configurations. Multiple configurations can be stored in successive series of memory locations within memory 205. Upon power-up, the internal address counters in memory. 205 are reset so configuration begins with the first program stored in memory. Holding the output-enable pin low leaves the address counters unchanged after configuration is complete. Pulling the DONE line low then begins a new configuration, this time from where the address counters left off after the first configuration. FPGA 210 is then reconfigured with the second program in memory. For a more detailed discussion of system 200, see the Xilinx product specification entitled "Spartan Family of One-Time Programmable Configuration PROMs (XC17S00), " DS030 (v1.7), Apr. 7, 2001, which is incorporated herein by reference.

System 200 is problematic for a number of reasons. First, the method fails if a user applies a reset during the configuration process because the address counter will not properly reset. This method must therefore never by used where there is any chance of a reset during configuration. Moreover, it can be difficult to update the contents of PROM 205 in the field, so system 200 offers limited flexibility.

Figure 3:
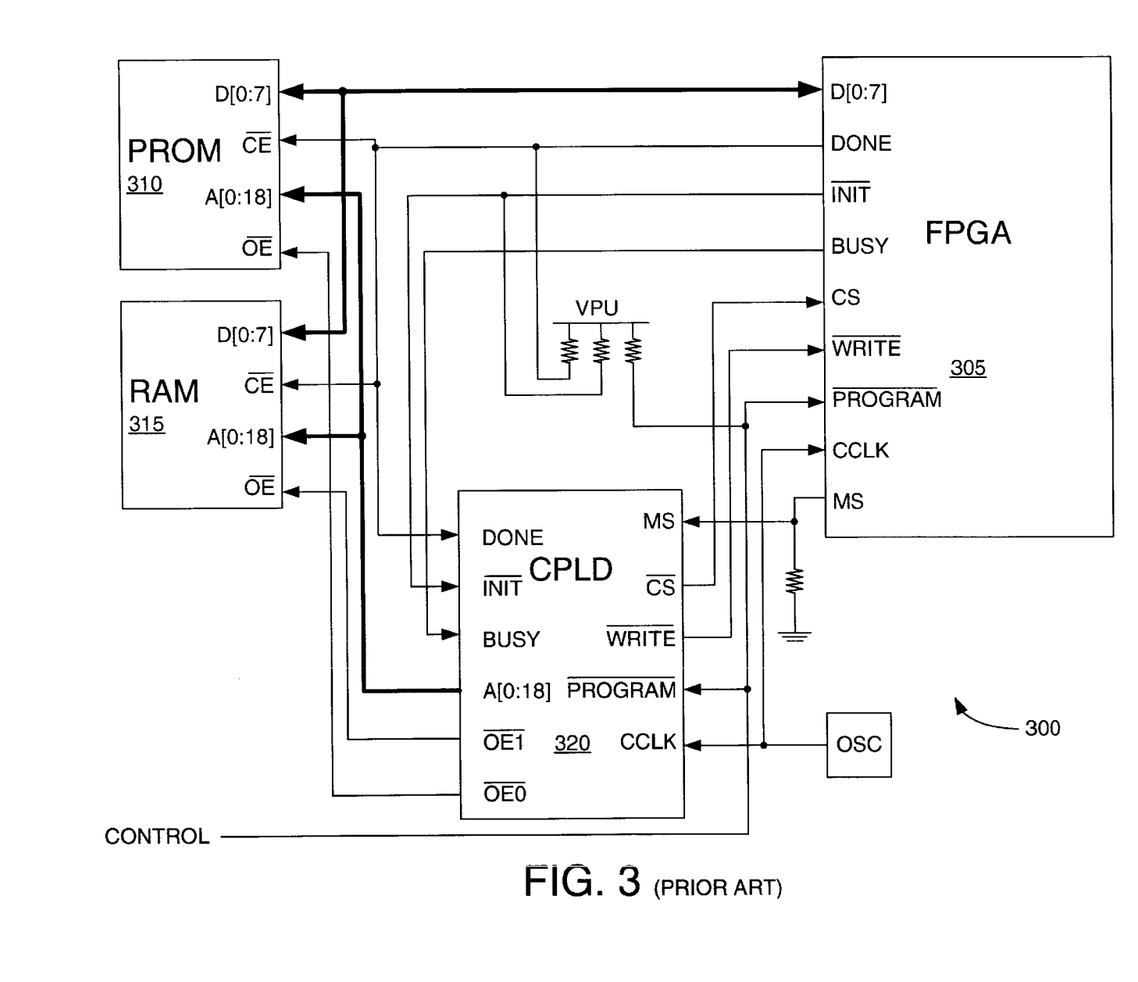
FIG. 3, (prior art) depicts a system 300 that addresses some of the deficiencies of system 200 of FIG. 2.

FIG. 3 (prior art) depicts a system 300 that addresses some of the deficiencies of system 200 of FIG. 2. System 300 includes an FPGA 305 adapted to receive configuration data from either a PROM 310 or a RAM 315. System 300 employs parallel memories because they are available in greater storage capacities than serial memories, but either type can be used.

System 300 also includes a second programmable logic device, CPLD 320, which acts as an interface to load configuration data from one of the memories to FPGA 305. In the parallel mode, CPLD 320 generates the memory-addresses and includes the requisite logic to differentiate between memories 310 and 315, depending upon the storage location of the desired configuration data. FPGA 305 identifies the memory from which to extract configuration data by providing an appropriate logic level on an I/O pin configured to provide a memory-select signal MS to a like-named input of CPLD 320. The I/O pins of° FPGA 305 are tri-stated during reconfiguration, so CPLD 320 latches the memory select signal before reconfiguring FPGA 305. Line MS connects a programmable I/O pin of FPGA 305 to a programmable I/O pin of CPLD 320. A pull-down resistor ensures that the initial configuration is selected from PROM 310. Alternatively, CPLD 320 can provide a pull-down signal for this purpose. Serial data systems similar to system 300 typically use a CPLD to increment addresses and select between memories. For a more detailed discussion of system 200, see the Xilinx Advance Application Note entitled "Configuring Spartan-II FPGAs from Parallel EPROMs," XAPP178 (v0.9) Dec. 3, 1999, which is incorporated herein by reference.

System 300 provides the desired functionality, but at the added expense and complexity of an additional integrated circuit. There is therefore a need for a simpler and less expensive system, for configuring a, programmable logic device from one of a number of sets of configuration data.

SUMMARY

The present invention is directed to programmable logic systems in which programmable logic devices can select from among a plurality of memory spaces from which to receive configuration data. In some embodiments, an input/output block of a programmable logic device is adapted to store a value identifying a remote memory space as a source of reconfiguration data. In other embodiments, external memory spaces for storing configuration data are adapted to store the value. In either case, the programmable logic device can be configured to control the source of data from which the device will be reconfigured.

The claims, and not this summary, define the scope of the invention.

DETAILED DESCRIPTION

Figure 4:
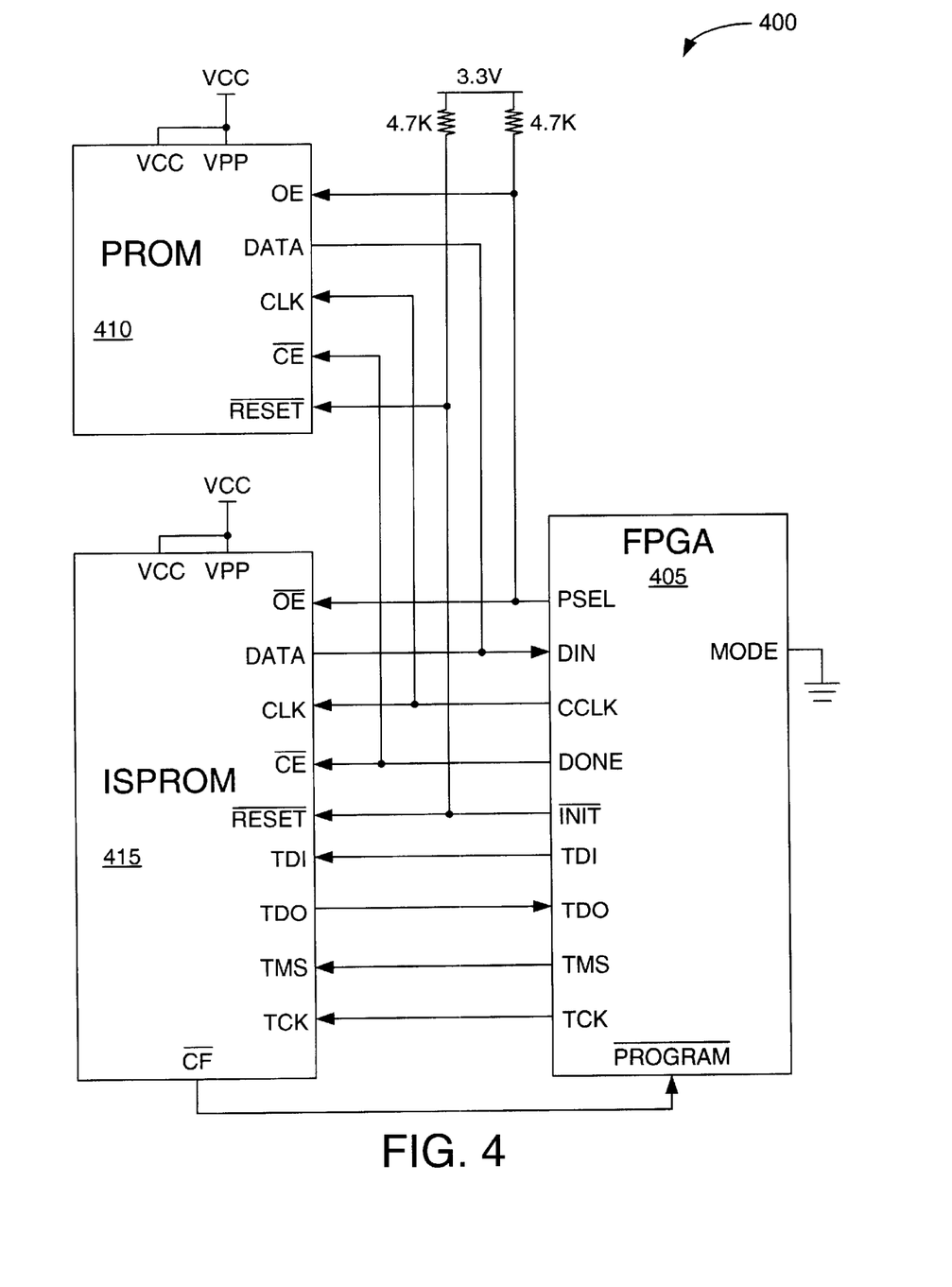
FIG. 4 depicts a system 400 in which an FPGA 405 is adapted in accordance with the invention to selectively accept configuration data from either of two memories 410 and 415.

FIG. 4 depicts a system 400 in which an FPGA 405 is adapted in accordance with the invention to selectively accept configuration data from either of two memories 410 and 415. In addition to the pins discussed above in connection with FIG. 2, FPGA 405 includes a program-select terminal PSEL connected to the output-enable terminals OE bar (overlined in the Figures) and OE of respective memories 410 and 415. In accordance with the invention, program-select terminal PSEL maintains a selected output signal during reconfiguration, and thereby enables a selected one of memories 410 and 415. FPGA 405 can therefore choose to be reconfigured using configuration data from either memory 410 or memory 415.

Program-select terminal PSEL is tri-stated during initial configuration. A weak pull-up resistor is thus allowed to pull the output-enable terminals of memories 410 and 415 high during configuration; FPGA 405 consequently configures itself using the configuration data in memory 410. Once operational, FPGA 405 can receive or generate commands to reconfigure itself, and can further specify on terminal PSEL the source of the configuration data. If FPGA 405 produces a logic zero on program-select terminal PSEL during a subsequent reconfiguration, then the configuration data for the subsequent reconfiguration will come from memory 415.

In the example, memory 410 is a PROM and memory 415 an in-system-programmable, read-only memory (ISPROM), but this need not be the case; indeed, those of skill in the art are familiar with myriad means of storing digital data, and new means will be discovered. For the present disclosure, a "memory space" includes any collection of memory elements capable of storing configuration data for transmission to a programmable logic device.

In one embodiment, memory 415 is a member of the XC18V00 family of products available from Xilinx, Inc. These ISPROMs can be programmed in-system using the IEEE 1149.1 boundary-scan (JTAG) Test Access Port (TAP), which consists of terminals TDI, TDO, TMS, and TCK. Four IOBs within FPGA 405 are configured to communicate with memory 415 via the TAP to program memory 415 with configuration data required for a subsequent FPGA configuration. The XC18V00 devices also incorporate a pin named CF that is controllable through the JTAG CONFIG instruction. Executing the CONFIG instruction through the JTAG TAP pulses the CF low for 300–500 ns, which resets FPGA 405 and initiates reconfiguration.

The JTAG TAP enables FPGA 405 to communicate configuration data to memory 415. FPGA 405 can therefore retrieve configuration data from a remote source (not shown) and store the configuration data in memory 415. FPGA 405 can then issue a JTAG CONFIG instruction via the TAP to force a reconfiguration using the newly acquired configuration data. The utility of this aspect of the invention is explored in more detail in connection with FIG. 7. For a more detailed discussion of the XC18V00 family of devices, see the Product Specification entitled "XC18V00 Series of-In-System Programmable Configuration PROMs, "DS026 (v2.9) Sep. 28, 2001, which is incorporated herein by reference.

Figure 5:
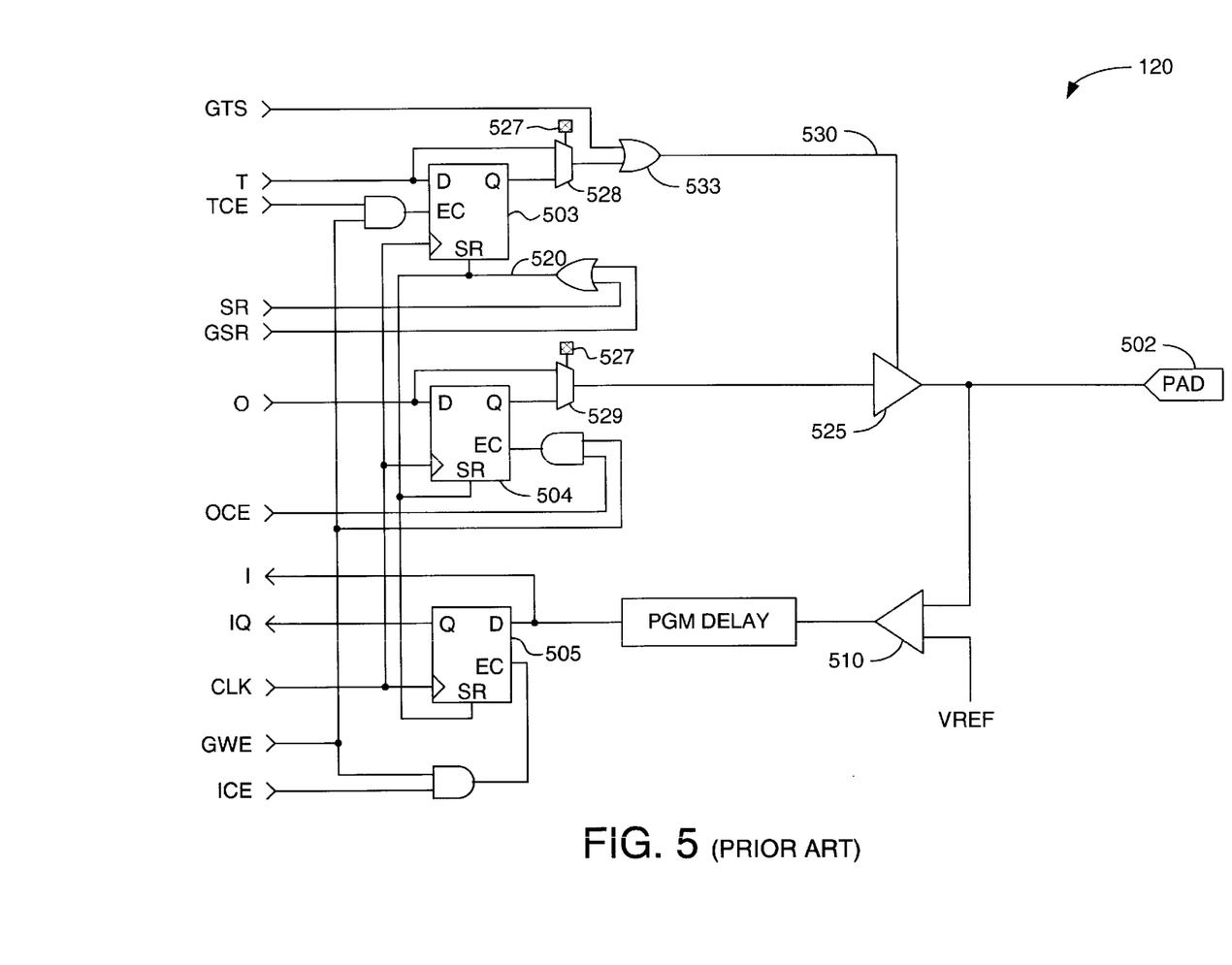
FIG. 5 (prior art) depicts an exemplary IOB 120 similar to those of the Virtex™ family of devices available from Xilinx, Inc.

FIG. 5 (prior art) depicts an exemplary IOB 120 similar to those of the Virtex™ family of devices available from Xilinx, Inc. IOB 120 provides the interface between an external package pad 502 and some internal circuitry (e.g., CLBs 110 of. FIG. 1) via general interconnect lines 130 and 140 (also of FIG. 1). IOB 120 can be configured for input, output, or bidirectional signals. When configured as an input block, IOB 120 conveys input signals into internal circuitry of FPGA 100 from I/O pad 502 through an input buffer 510. When IOB 120 is configured as an output block, IOB 120 conveys output signals from internal circuitry to I/O pad 502 through output buffer 525. A more complete discussion of IOB 120 can be found in Xilinx, Inc., Virtex Data Sheet, Xcell, Issue 31, First Quarter 1999, at pp. 41–53, which is incorporated herein by reference.

IOB 120 includes three sequential storage elements 503, 504, and 505. Each storage element includes an enable-clock input EC, and a set/reset input SR. Configuration memory cells control the various programmable elements depicted in FIG. 5. Two configuration memory cells 527 are shown to control a corresponding pair of multiplexers 528 and 529; other memory cells are omitted for brevity.

A local set/reset line SR controls the logic level on set/reset line 520, and therefore sets and resets storage elements 503, 504, and 505. Storage elements 503, 504, and 505 (and the similar storage elements in the other IOBs and CLBs) can also be globally set or reset. Thus, storage elements 503, 504, and 505 can be reset by either a local set/reset signal on line SR or a global set/reset signal on global set/reset line GSR.

IOB 120 includes an output buffer 525 that can be tri-stated by-providing a signal on a line 530. I/O pad 502 can be tri-stated individually by asserting local tri-state line T, or all of IOBs 120 of FIG. 1 can be globally tri-stated using global tri-state line GTS. An OR gate 533 passes the local and global tri-state signals to tri-state buffer 525 via line 530. IOB 120 is described in more detail in U.S. patent application Ser. No. 6,191,613, which is incorporated herein by reference.

IOB 120 tri-states pad 502 during configuration to avoid data contention. IOB 120 is therefore not capable of selecting from among multiple memory spaces to retrieve configuration memory.

Figure 6:
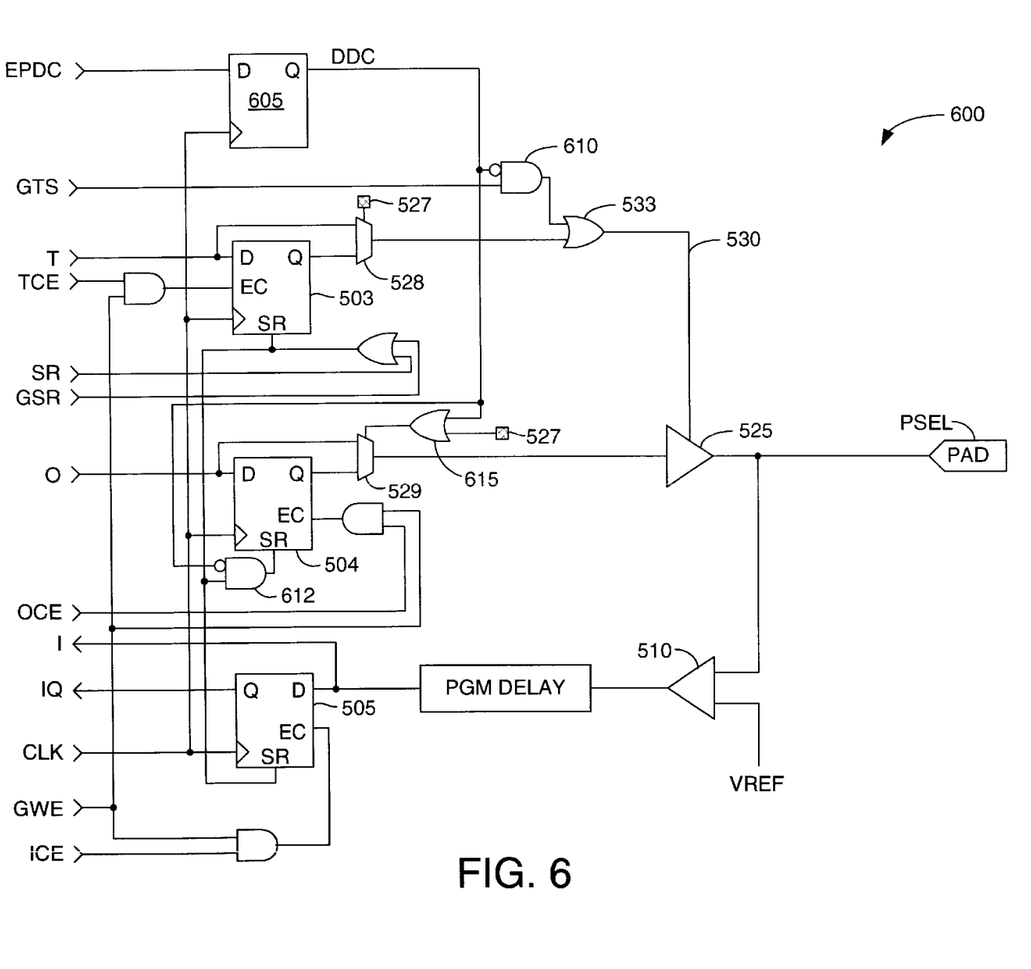
FIG. 6 depicts an IOB 600 modified in accordance with the invention to present data on an output pin of a programmable logic device during reconfiguration.

FIG. 6 depicts an IOB 600 modified in accordance with the invention to present data on an input/output pin of a programmable logic device during reconfiguration. Many of the elements in IOB 600 are similar to those of IOB 500 of FIG. 5, like-numbered elements being the same.

In addition to the components of IOB 500, IOB 600 includes a register 605, AND gates 610 and 612, and an OR gate 615. If register 605 stores a logic zero, IOB 600 functions in the same manner as IOB 500 of FIG. 5. If, on the other hand, register 605 stores a logic one, register 605 produces a drive-during-configuration signal DDC to AND gate 610, AND gate 612, and OR gate 615. AND gate 610 then blocks global tri-state signal GTS from OR gate 533, and consequently prevents IOB 600 from tri-stating during reconfiguration; AND gate 612 blocks set and reset signals GSR and SR from setting or resetting register 504; and OR gate 620 provides signal DDC to MUX 529, causing MUX 529 to present the output Q of register 504 to the input of tri-state buffer 525. IOB 600 thus outputs the logic level stored in register 504 on pad 502 during configuration if register 605 is set to store a logic one. Register 605 is set by the active FPGA driving an enable-pad-during-configuration signal EPDC on an input to IOB 600 connected to the general interconnect.

Registers 504 and 605 are programmably connected to the routing and logic resources of the FPGA. The FPGA can therefore be configured to include a logic circuit capable of developing the appropriate logic signals to cause IOB 600 to provide an appropriate logic level on pad 502 during reconfiguration. Register 504 can thus be used to store a value identifying an external memory space, from which configuration data is to be received.

The embodiments depicted above can be extended to include more than two possible memory spaces from which to receive configuration data. Such extended embodiments use a collection of registers to store values identifying a desired memory space. For example, two IOBs 600 might be used to specify up to four memory spaces. Such collections of IOBs can share a single register 605. Register 605 can also be a latch.

Figure 7:
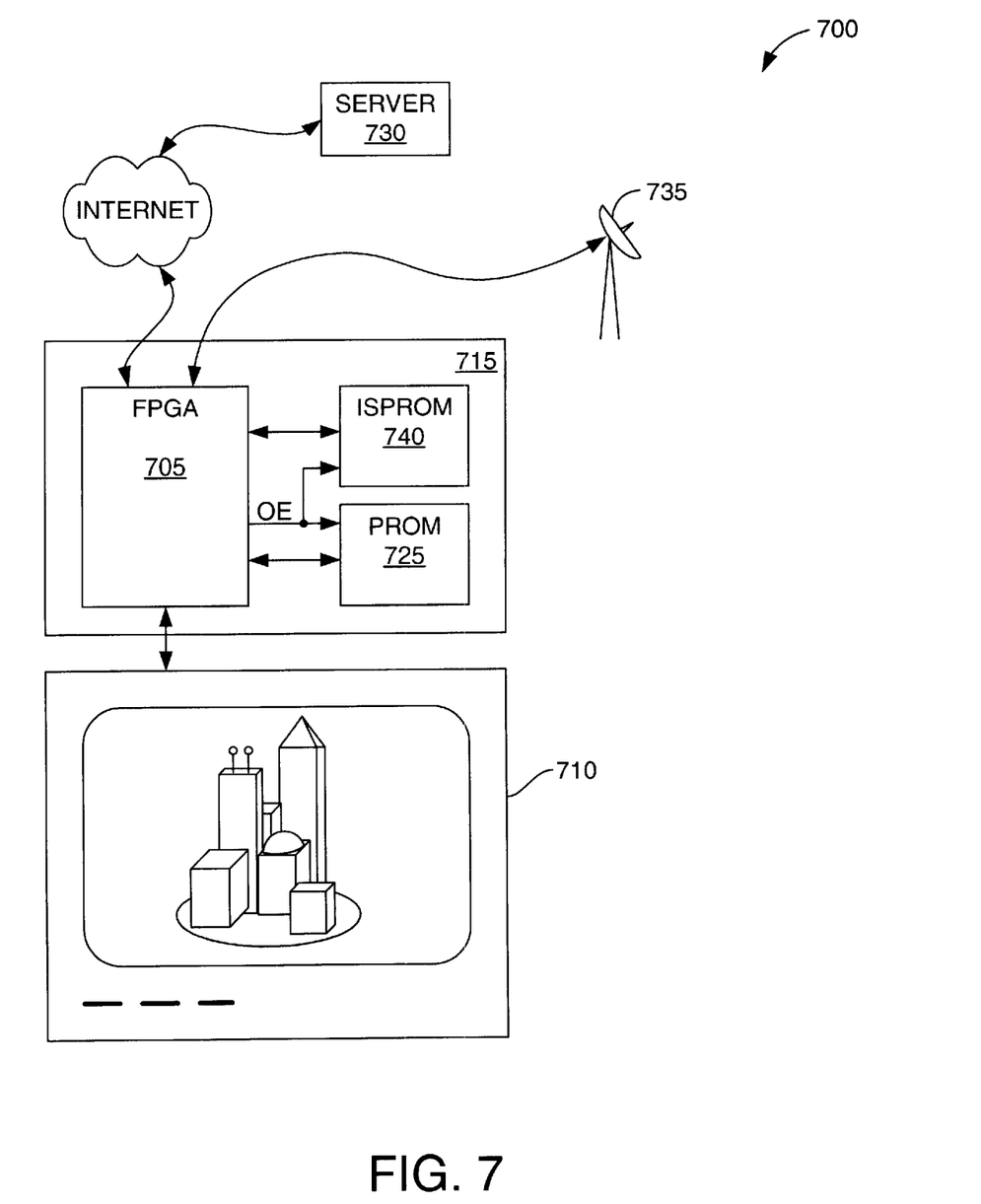
FIG. 7 depicts a digital television system 700 that takes advantage of an FPGA 705 adapted in accordance with the invention.

FIG. 7 depicts a digital television system 700 that takes advantage of an FPGA 705 adapted in accordance with the invention. System 700 includes a television set 710 connected to a digital set-top box 715. Set-top box 715 communicates with one or more external data sources via FPGA 705. FPGA 705 facilitates this communication based on configuration data stored within a local memory 725, a PROM in this example.

In operation, FPGA 705 is configured on power up using configuration data stored within memory 725. The resulting configuration might be, for example, a communication circuit adapted to automatically download configuration data from a server 730 over the Internet and store the configuration data in a local memory 740, an ISPROM in one embodiments. FPGA 705 might also be configured to receive configuration data from a broadcast source, such as a satellite antenna 735 or a terrestrial cable, and store that data in local memory. With the new configuration data loaded in local memory 740, FPGA 705 can issue an instruction disabling memory 725 and enabling memory 740 so FPGA 705 reconfigures itself using the newly received configuration data. This new configuration would then define within FPGA 705 a circuit capable of interpreting e.g. digital video signals. System 700, manufactured as a general-purpose system, can therefore be upgraded without hardware changes or user intervention.

Figure 8:
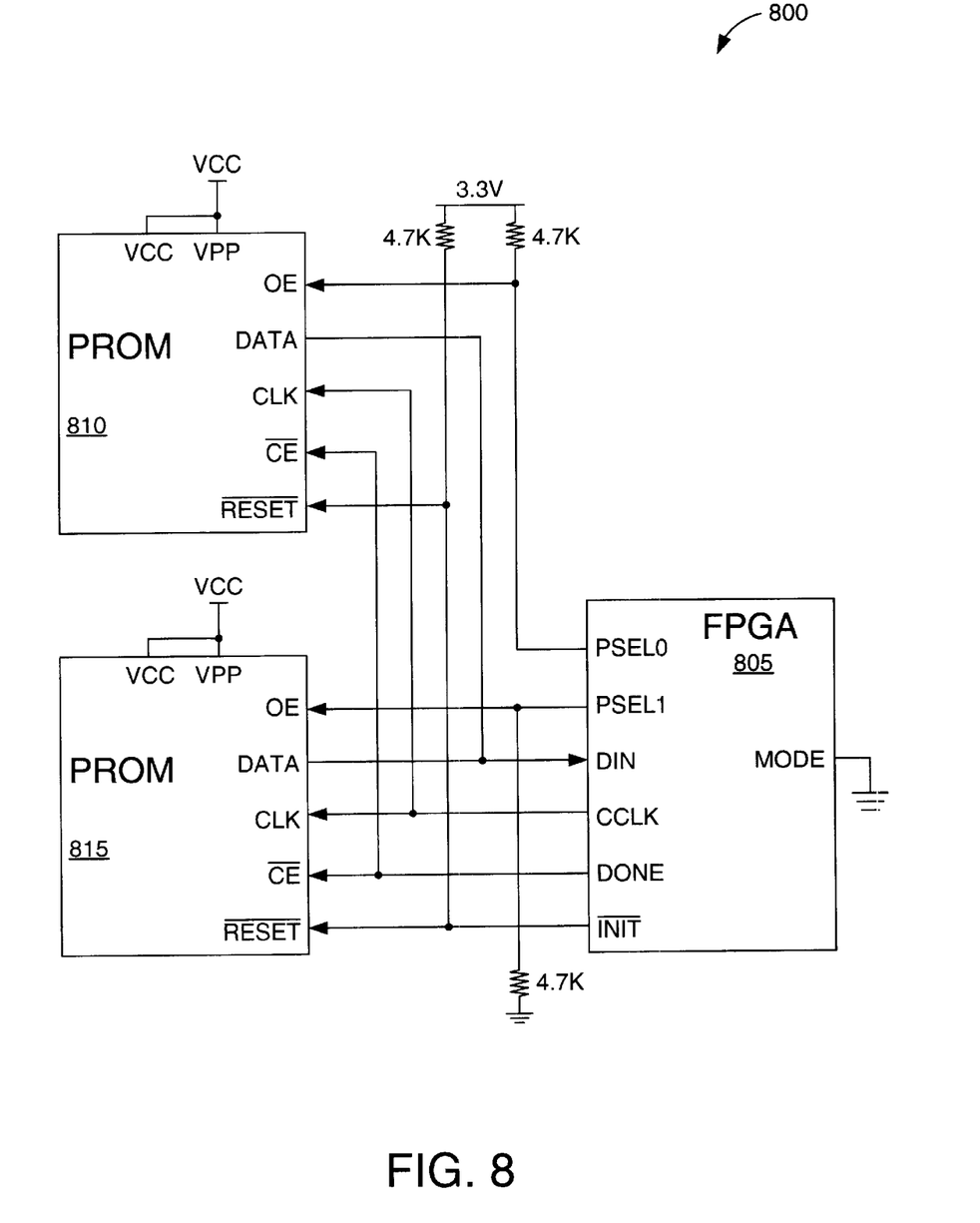
FIG. 8 depicts a system 800 in accordance with another embodiment of the invention.

FIG. 8 depicts a system 800 in accordance with another embodiment of the invention. System 800 includes an FPGA 805 adapted to include at least two IOBs (not shown) with the ability to present data on their respective output pins during reconfiguration. A first program-select terminal PSEL0 connected to a first memory 810 and a second program-select terminal PSEL1 connected to a second memory 815 together control the source of configuration data. Pull-up resistors 820 and 825 respectively enable and disable memories 810 and 815 so that FPGA 805 is initially configured from memory 810. Subsequent reconfigurations can be accomplished using the configuration data in either memory using program-select pins PSEL0 and PSEL1 in the manner described above in connection with FIGS. 4–6.

Figure 9:
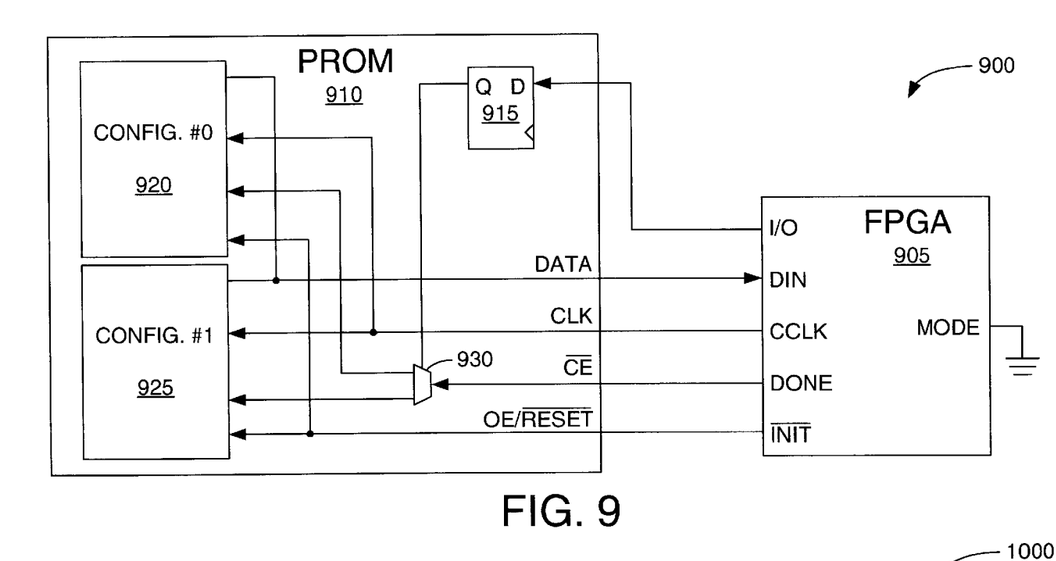
FIG. 9 depicts a system 900 in accordance with another embodiment of the invention.

FIG. 9 depicts a system 900 in accordance with another embodiment of the invention. System 900 includes a conventional FPGA 905 connected to a memory 910 modified in accordance with the invention. Memory 910, a PROM in this embodiment, includes a register 915 connected to a standard I/O pin of FPGA 905. FPGA 905 can set register 915 to a one or a zero, depending upon whether FPGA 905 is to be reconfigured from a first memory space 920 or a second memory space 925. The value stored in register 915 controls a de-multiplexer 930 that enables a selected one of memory spaces 920 and 925. System 900 requires only one memory chip, or die, and may therefore be more economical than similar systems in which two chips are used.

System 900 employs an internal counter (not shown) in PROM 910 to step through memory locations in which configuration data is stored. In embodiments in which addresses are provided to a memory, FPGA 905 can be configured in accordance with the invention to provide a value (0 or 1) to a high-order address bit during reconfiguration. The FPGA would then be configured using e.g. the lower series of addresses when the FPGA specifies a logic zero during reconfiguration and the higher-series of addresses when the FPGA specifies a logic one.

Figure 10:
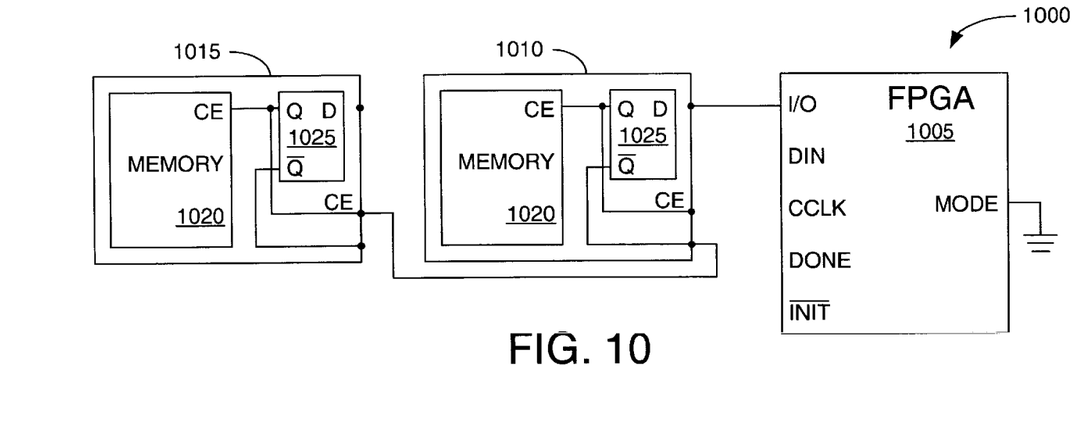
FIG. 10 depicts a system 1000 in accordance with yet another embodiment of the invention.

FIG. 10 depicts a system 1000 in accordance with yet another embodiment of the invention. System 1000 includes a conventional FPGA 1005 connected to a pair of memory chips 1010 and 1015, each of which includes a memory space 1020. One or both of memories 1010 and 1015 is also modified in accordance with the invention to include a register 1025 that can be loaded to determine the source of configuration data for FPGA 1005. In the depicted embodiment, register 1025 within memory 1010 controls which memory 1010 or 1015 is enabled, and therefore which memory space 1020 provides While the present invention has been described in connection with specific embodiments, variations of these embodiments will be obvious to those of ordinary skill in the art. For example, the embodiments depicted above can be employed by programmable logic devices other than FPGAs. Moreover, some components are shown directly connected to one another while others are shown connected via intermediate. components. In each instance the method of interconnection establishes some desired electrical communication between two or more circuit nodes, or terminals. Therefore, the spirit and scope of the appended claims should not be limited to the foregoing description.

What is claimed is:

1. A system comprising:
    a. a first memory space adapted to store a first set of configuration data for defining a first logic function;
    b. a second memory space adapted to store a second set of configuration data for defining a second logic function; and
    c. a programmable logic device having:
        i a data-source register connected to at least one of the first and second memory spaces and adapted to store a value identifying one of the first and second memory spaces; and
        ii. at least one data terminal connected to the first and second memory spaces and adapted to receive the one of the first and second sets of configuration data stored in the one of the first and second memory spaces identified by the value.

2. The system of claim 1, wherein the first logic function defines a circuit on the programmable logic device, and wherein the circuit is adapted to provide the value identifying the second memory space.

3. The system of claim 1, wherein the data-source register stores more than one data bit.

4. The system of claim 1, wherein the first and second memory spaces are formed on a single semiconductor die.

5. The system of claim 1, wherein the first memory space comprises a programmable read-only memory.

6. The system of claim 1, wherein the data terminal receives a serial data stream.

7. The system of claim 1, wherein the first memory space comprises an enable terminal connected to the data-source register of the programmable logic device.

8. The system of claim 1, wherein the programmable logic device comprising a programmable input/output block that includes the data-source register.

9. A system comprising:
   a. a first memory space adapted to store a first set of configuration data for defining a first logic function;
   b. a second memory spade adapted to store a second set of configuration data for defining a second logic function;
   c. a data-source register connected to at least one of the first and second memory spaces and adapted to store a value identifying one of the first and second memory spaces; and
   d. configurable logic having at least one data terminal connected to the first and second memory spaces and adapted to receive the one of the first and second sets of configuration data stored in the one of the first and second memory spaces identified by the value;
   e. wherein the data source register and the first memory space reside on a single memory chip.

10. The system of claim 9, wherein the first and second memory spaces reside on a single memory chip.

11. A system comprising:
    a. a first memory space adapted to store a first set of configuration data for defining a first logic function;
    b. a second memory space adapted to store a second set of configuration data for defining a second logic function;
    c. a data-source register connected to at least one of the first and second memory spaces and adapted to store a value identifying one of the first and second memory spaces; and
    d. configurable logic having at least one data terminal connected to the first and second memory spaces and adapted to receive the one of the first and second sets of configuration data stored in the one of the first and second memory spaces identified by the value;
    e. wherein the data source register and the configurable logic reside on a single programmable logic device.

12. The system of claim 11, wherein the first and second memory spaces reside on a single memory chip.

13. An input/output block for a programmable logic device, the input/output block comprising:
    a. an input/output pad;
    b. a tri-state buffer having an input terminal, and output terminal, and a tri-state control terminal and a tri-statable output terminal connected to the input/output pad; and
    c. a drive-during-configuration line adapted to convey a drive-during-configuration signal to the tri-state control terminal, wherein the drive-during-configuration signal selectively enables the tri-state buffer while the programmable logic device is configured.

14. The input/output block of claim 13, wherein the programmable logic device may be configured to include a logic circuit for controlling the drive-during-configuration line.

15. The input/output block of claim 13, further comprising a global tri-state line adapted to convey a global tri-state signal to the tri-state control terminal and to other input/output blocks on the programmable logic device; wherein the drive-during-configuration signal blocks the global tri-state signal from the tri-state control signal.

16. A method of reconfiguring a programmable logic device, the method comprising:
    a. programming the programmable logic device using a first set of configuration data;
    b. storing a value in the programmable logic device indicating a source of a second set of configuration data; and
    c. reconfiguring the programmable logic device using the second set of configuration data.

17. The method of claim 16, further comprising presenting the value on a pad of the programmable logic device while reconfiguring the programmable logic device using the second set of configuration data.

18. The method of claim 16, wherein the value is stored in the programmable logic device.

19. The method of claim 16, wherein the value is stored in a memory with at least one of the first and second sets of configuration data.

20. A system comprising:
    a. a programmable logic device;
    b. a first memory space selectively connected to the programmable logic device and adapted to store a first set of configuration data for defining a first logic function of the programmable logic device;
    c. a second memory space selectively connected to the programmable logic device and adapted to store a second set of configuration data for defining a second logic function of the programmable logic device; and
    d. means on the programmable logic device for storing a value selecting one of the first and second memory spaces during configuration.

21. The system of claim 20, wherein the means on the programmable logic device for storing the value comprises configurable output circuitry.

* * * * *